US005675603A

United States Patent [19]

Jenkins

[11] Patent Number: 5,675,603

[45] Date of Patent: Oct. 7, 1997

[54] LASER DEVICE

[75] Inventor: Richard M. Jenkins, Malvern, Great Britain

[73] Assignee: The Secretary of State for Defence in her Britannic Majesty's Government of the United Kingdom of Great Britain and Northern Ireland of Defence Evaluation and Research Agency, Hampshire, United Kingdom

[21] Appl. No.: 571,921

[22] PCT Filed: Jun. 15, 1994

[86] PCT No.: PCT/GB94/01286

§ 371 Date: Jan. 19, 1996

§ 102(e) Date: Jan. 19, 1996

[87] PCT Pub. No.: WO95/02264

PCT Pub. Date: Jan. 19, 1995

[30] Foreign Application Priority Data

Jul. 3, 1993 [GB] United Kingdom ............... 9313823

[51] Int. Cl.⁶ .............................................. H01S 3/03
[52] U.S. Cl. .................. 372/64; 322/92; 322/97; 322/98; 322/107
[58] Field of Search ..................... 372/64, 97, 12, 372/92, 98, 107

[56] References Cited

U.S. PATENT DOCUMENTS

| | | | |
|---|---|---|---|
| 3,970,963 | 7/1976 | Chester | 372/64 |
| 4,103,255 | 7/1978 | Schlossberg | 372/64 |
| 4,302,730 | 11/1981 | Jernigan | 372/97 |
| 4,429,398 | 1/1984 | Chenausky et al. | 372/64 |
| 4,438,514 | 3/1984 | Chenausky et al. | 372/64 |
| 4,688,228 | 8/1987 | Newman et al. | 372/64 |
| 4,703,489 | 10/1987 | Ross | 372/64 |
| 4,719,640 | 1/1988 | Chenausky et al. | 372/64 |
| 4,807,234 | 2/1989 | Hart et al. | 372/64 |
| 4,879,721 | 11/1989 | Braski et al. | 372/64 |
| 4,884,282 | 11/1989 | Bridges | 372/64 |
| 5,353,297 | 10/1994 | Koop et al. | 372/64 |
| 5,357,539 | 10/1994 | Otani et al. | 372/107 |

FOREIGN PATENT DOCUMENTS

| 1 266 067 | 3/1972 | United Kingdom . |
|---|---|---|
| WOA92 11550 | 7/1992 | WIPO . |

Primary Examiner—Leon Scott, Jr.
Attorney, Agent, or Firm—Nixon & Vanderhye P.C.

[57] ABSTRACT

A laser device incorporates a rectangular multi-mode beam-splitter waveguide connected at one end to a retro-reflecting mirror. The beamsplitter waveguide is connected at a second end to an output coupling waveguide and a reflection coupling waveguide. The reflection coupling waveguide is terminated by a second retro-reflecting mirror. Radiation produced within the device is reflected by the mirror and coupled to the two coupling waveguides in a manner such that a partially reflecting mirror is not required at an output to the device.

20 Claims, 6 Drawing Sheets

LASER DEVICE

BACKGROUND OF THE INVENTION

1. Field of the Invention

This invention relates to a laser device.

2. Discussion of Prior Art

Lasers are well known in the prior art, having been first invented in 1960 by T. H. Maiman. In a laser, electromagnetic radiation is reflected between two ends of a resonating cavity stimulating transitions from excited energy levels to lower energy levels, which results in the generation of further photons in phase and travelling in the same direction as the stimulating radiation. The ends of the cavity must be sufficiently reflecting so that the amount of radiation absorbed or transmitted at the mirror is less than or equal to the amount of radiation generated by this stimulation process. Prior art lasers include a partially reflecting cavity mirror in their construction to reflect a high percentage of incident radiation back into the cavity and transmit a small fraction as the laser beam. Partially reflecting mirrors incorporating a number of dielectric layers are relatively expensive to produce; also, partially reflecting mirrors are susceptible to damage in high power applications.

An example of a laser device is a He:Ne gas filled laser as described on page 486 of the book 'Optics' by E. Hecht and A. Zajac published by the Addison-Wesley Publishing Company Inc. of Massachusetts USA in 1974.

SUMMARY OF THE INVENTION

The present invention provides a laser device including waveguiding means and first and second reflecting means arranged to define a resonant cavity, characterised in that the waveguiding means is arranged to define radiation intensity maxima at the first reflecting means, an intensity maximum at least transiently at the second reflecting means, and an intensity maximum at least transiently at an output separate from the first and second reflecting means.

The invention provides the advantage that a partially reflecting output mirror is not required, such mirrors being sensitive to power damage. This is the case particularly for high power carbon dioxide lasers.

The use of a multi-mode propagating waveguide configured as a laser is described in Patent Cooperation Treaty application number WO 92/11550. This describes a laser incorporating a partially reflecting mirror. Patent Cooperation Treaty patent application number WO 92/11554 describes the use of a multi-mode waveguide as an intensity dividing device.

The laser device of the invention may have a multi-mode beamsplitter waveguide which at a first end is connected to two coupling waveguides, one of which is a reflection coupling waveguide and one of which is an output coupling waveguide. The reflection coupling waveguide is terminated by a fully reflecting mirror. Reflecting means are arranged at a second end of the beamsplitter waveguide.

The device may be arranged so that approximately 85% of radiation coupled to the coupling waveguides is coupled to the reflection coupling waveguide and the remaining 15% is coupled to the output coupling waveguide.

The reflecting means at the second end of the beamsplitter waveguide may include modulation waveguides. The modulation waveguides may be arranged to provide phase control of radiation reflected by the reflecting means. Electro-optic phase modulators may be arranged within the modulation waveguides. These phase modulators may be arranged to correct for changes in the dimensions of the device due to thermal effects; they may also be arranged to operate the device in a Q-switched mode by switching radiation intensity maxima between the coupling waveguides. Operation as a Q-switched laser device gives the advantage that a high intensity pulsed output may be produced. The intensity of the output of the laser device may be controlled by controlling the phase modulators.

The reflecting means at the second end of the beamsplitter waveguide may be a flat mirror, and the radiation intensity maxima coupled to the two coupling waveguides may be of equal intensity.

The laser device may be a gas laser with hollow waveguides. The gas provides a gain medium with energy coupled into the gain medium by RF electrodes. Alternatively the laser device may be formed of ridge waveguides of a semiconductor material system which acts as a gain medium. The medium may be excited by a current flowing through the device.

The laser device may have an output coupling waveguide at both ends of the beamsplitter waveguide. Radiation output beams emitted by these output coupling waveguides may be equal intensity with a constant phase relationship between the output beams.

BRIEF DESCRIPTION OF THE DRAWINGS

In order that the invention might be more fully understood, embodiments thereof will now be described, by way of example only, with reference to the accompanying drawings, in which.

DETAILED DESCRIPTION OF PREFERRED EMBODIMENTS

Figure 1:
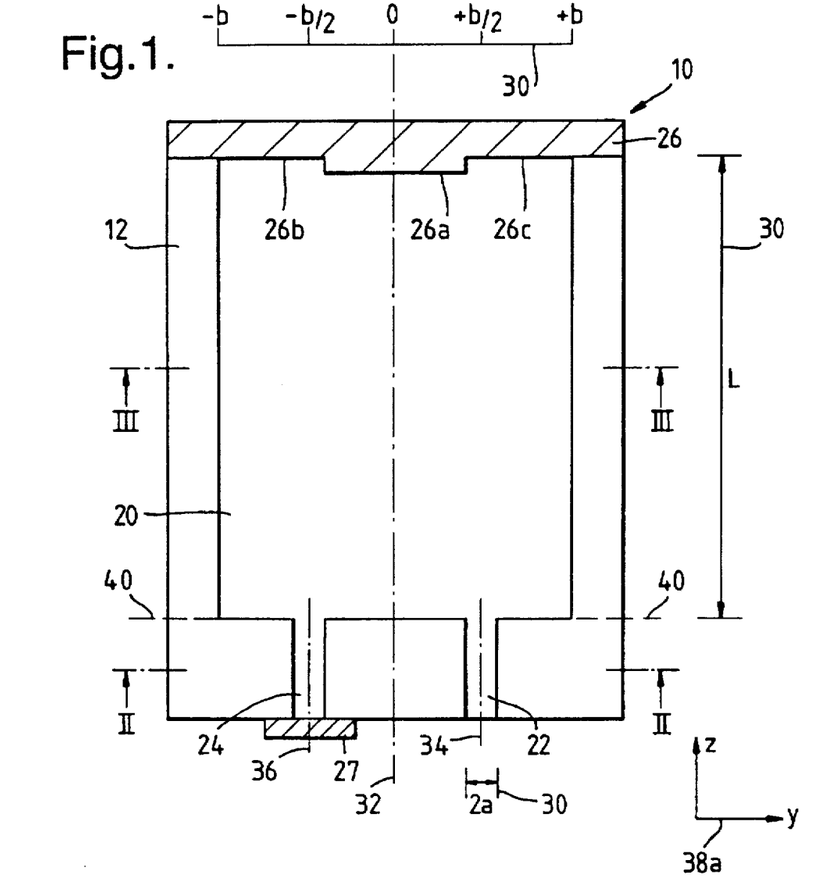
FIG. 1 is a horizontal sectional plan view of a laser device of the invention.
Figure 2:
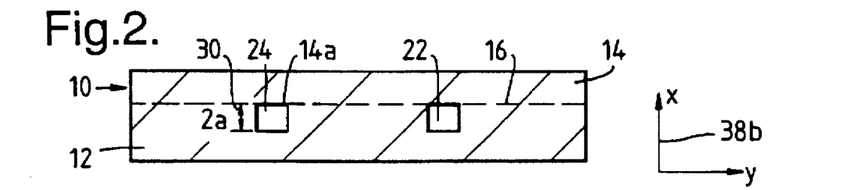
FIGS. 2 and 3 are vertical sections along lines II—II and III—III respectively of FIG. 1.
Figure 3:
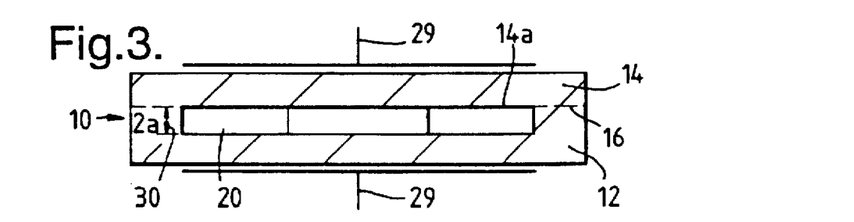

Referring to FIGS. 1, 2 and 3, there are shown sectional views of a laser device of the invention indicated generally by 10. FIG. 1 is a horizontal sectional view of the laser device 10. Vertical sections on lines II—II and III—III in FIG. 1 are shown in FIGS. 2 and 3 respectively.

The laser device 10 incorporates two sheets of alumina, these being a base sheet 12 and a cover sheet 14. The sheets 12 and 14 are plane surfaced and parallel to one another. The position of the interface between the cover sheet 14 and the base sheet 12 is indicated by dashed lines 16 in FIGS. 2 and 3.

The base sheet 12 is formed from a solid piece of alumina by milling to produce a beamsplitter waveguide 20 with an output coupling waveguide 22 and a reflection coupling waveguide 24. The waveguides 20, 22, and 24 have side walls and lower walls (not shown) defined by flat surfaces formed by the milling of sheet 12. They have upper walls provided by a lower surface 14a of the cover sheet 14.

The device 10 incorporates retro-reflecting mirrors 26 and 27 of high reflectivity copper. The mirror 26 has a stepped profile defining three reflecting regions 26a, 26b, and 26c.

Radio frequency electrodes 29 are positioned above and below the beamsplitter waveguide 20 to couple energy capacitively into a gain medium within the waveguide.

The beamsplitter waveguide 20 is of rectangular cross-section, being of length L, width 2d and height 2a as indicated by scales 30. Here, L, a, and b are parameters which may vary between different embodiments of the invention. In the device 10, b=6a. The coupling waveguides 22 and 24 are of square section with side 2a. The length L of the beamsplitter waveguide 20 is given by:

$$L = 2nb^2/\lambda_o \quad (1.1)$$

where $\lambda_o$ is a free space operating wavelength of the device 10 and n is the refractive index of the medium within the beamsplitter waveguide 20. Alternatively, replacing $n/\lambda_o$ by $\lambda$, the propagating wavelength in the beamsplitter waveguide, Equation (1.1) becomes:

$$L = 2b^2/\lambda \quad (1.2)$$

In the device 10, 2b=4 mm, 2a=0.67 mm and L=0.755 m for an operating wavelength $\lambda$ of 10.59 μm. The sizes of 2b and 2a may be influenced by manufacturing tolerances associated with the milling process and the power requirements of the laser device.

The beamsplitter waveguide 20 has a central longitudinal axis 32 indicated by a dashed line. The axis 32 is a distance b from the side walls and a distance a from the lower wall of waveguide 20. The coupling waveguides 22 and 24 have respective central longitudinal axes 34 and 36, which are parallel and coplanar with the axis 32. The axes 34 and 36 are located centrally of respective halves of the transverse cross-section of the beamsplitter waveguide 20, as indicated by the uppermost scale 30 in FIG. 1.

For the purpose of analysis of the operation of the device 10, y and z Cartesian co-ordinate axes are shown at 38a and the x and y axes are shown at 38b. The z axis is parallel to the device's longitudinal axis 32. The x and y axes are transverse vertical and transverse horizontal respectively. The longitudinal axis 32 contains x=0 and y=0. The value of z is zero in a plane where the coupling waveguides 22 and 24 merge with the beamsplitter waveguide 20 indicated by a chain line 40.

The device 10 is contained within a vacuum chamber (not shown) which is evacuated and back-filled with a controlled amount of a $CO_2$ laser gas of known composition. This gas acts as a gain medium within the beamsplitter waveguide 20. The vacuum chamber contains a window (not shown) which is transparent at the wavelength of the radiation produced by the device and which transmits radiation from the laser device. The vacuum chamber also contains electrical feedthroughs (not shown) connecting the RF electrodes 29 to a power supply (not shown).

The theoretical propagation characteristics of a general rectangular waveguide will now be analyzed. It is assumed that this waveguide has height 2a, width 2b and is bounded by walls of a homogeneous dielectric material with complex dielectric constant. It is also assumed that these walls are highly reflecting, and do not attenuate propagating waveguide modes significantly. The waveguide has a height, width and length dimensions which are parallel to the x, y and z axes respectively. It has normalized linearly polarized modes of the kind $EH_{mn}$. The electric field contribution $E_{mn}$ (x, y, z) of the $mn^{th}$ mode $EH_{mn}$ at the point (x, y, z) has been calculated by Laakmann et al. in Appl. Opt. Vol. 15, No. 5 May 1976, pages 1334–1340 as follows:

$$E_{mn}(x,y,z) = \frac{1}{\sqrt{(ab)}} \left[ \begin{matrix} \cos \\ \sin \end{matrix} \left( \frac{m\pi x}{2a} \right) \right] \left[ \begin{matrix} \cos \\ \sin \end{matrix} \left( \frac{n\pi y}{2b} \right) \right] e^{i\gamma_{mn}z} \quad (2)$$

where m is the mode number relating to the field dependency along the x axis, n is the mode number relating to the field dependency along the y axis, z is the distance along the z axis, $\gamma_{mn} = (\alpha_{mn} + i\beta_{mn})$, the propagation constant of the $mn^{th}$ mode, $\beta_{mn}$ and $\alpha_{mn}$ being the $mn^{th}$ mode's phase and attenuation coefficients, and "cos" above "sin" indicates the former applied to odd mode numbers (m or n as appropriate) and the latter to even mode numbers.

To a good approximation, the phase coefficient $\beta_{mn}$ is given by:

$$\beta_{mn} = \frac{2\pi}{\lambda} \left[ 1 - \left\{ \left( \frac{\lambda m}{4a} \right)^2 + \left( \frac{\lambda n}{4b} \right)^2 \right\} \right]^{\frac{1}{2}} \quad (3.1)$$

If the negative term in parentheses in Equation (3.1) is small compared with unity, that is if $\lambda/a$ and $\lambda/b$ are <1, and m and n are low order modes, which is satisfied in practice, then the binomial theorem may be used to rewrite Equation (3.1) as:

$$\beta_{mn} = \frac{2\pi}{\lambda} \left[ 1 - \frac{1}{2} \left\{ \left( \frac{\lambda m}{4a} \right)^2 + \left( \frac{\lambda n}{4b} \right)^2 \right\} \right] \quad (3.2)$$

where a, b, m and n are as previously defined, and $\lambda$ is the wavelength of the radiation propagating in the waveguide.

Equation (2) sets out the electric field contributions obtainable from all linearly polarised modes of a rectangular waveguide. It is calculated on the basis that the electric field contribution of each mode is zero at the side walls of the waveguides, i.e. at y=zb. This is satisfied for a waveguide with reflecting walls. Not all rectangular waveguide modes are necessarily excited by a given input. Any square section waveguide which is selected to provide an input supplies an excitation in the form of its fundamental or lowest order mode $EH_{11}$. This is coupled to the various $EH_{mn}$ modes of the rectangular section linear combination of the $EH_{mn}$ modes with respective complex multiplication coefficients $A_{mn}$. This is expressed by:

$$EH_{11} = \Sigma A_{mn} \cdot EH_{mn} \quad (4)$$

Essentially the $A_{mn}$ amplitude coupling coefficients are the coefficients of a Fourier series which represents the electric field at an input aperture where the relevant input waveguide merges into the rectangular waveguide. The $EH_{mn}$ modes are mutually orthogonal, and in consequence the coefficients $A_{mn}$ can be calculated from overlap integrals of the form:

$$A_{mn} = \int_{-b}^{+b} \int_{-a}^{+a} EH_{11} \cdot EH_{mn} \cdot dy \cdot dx. \tag{5}$$

Figure 4:
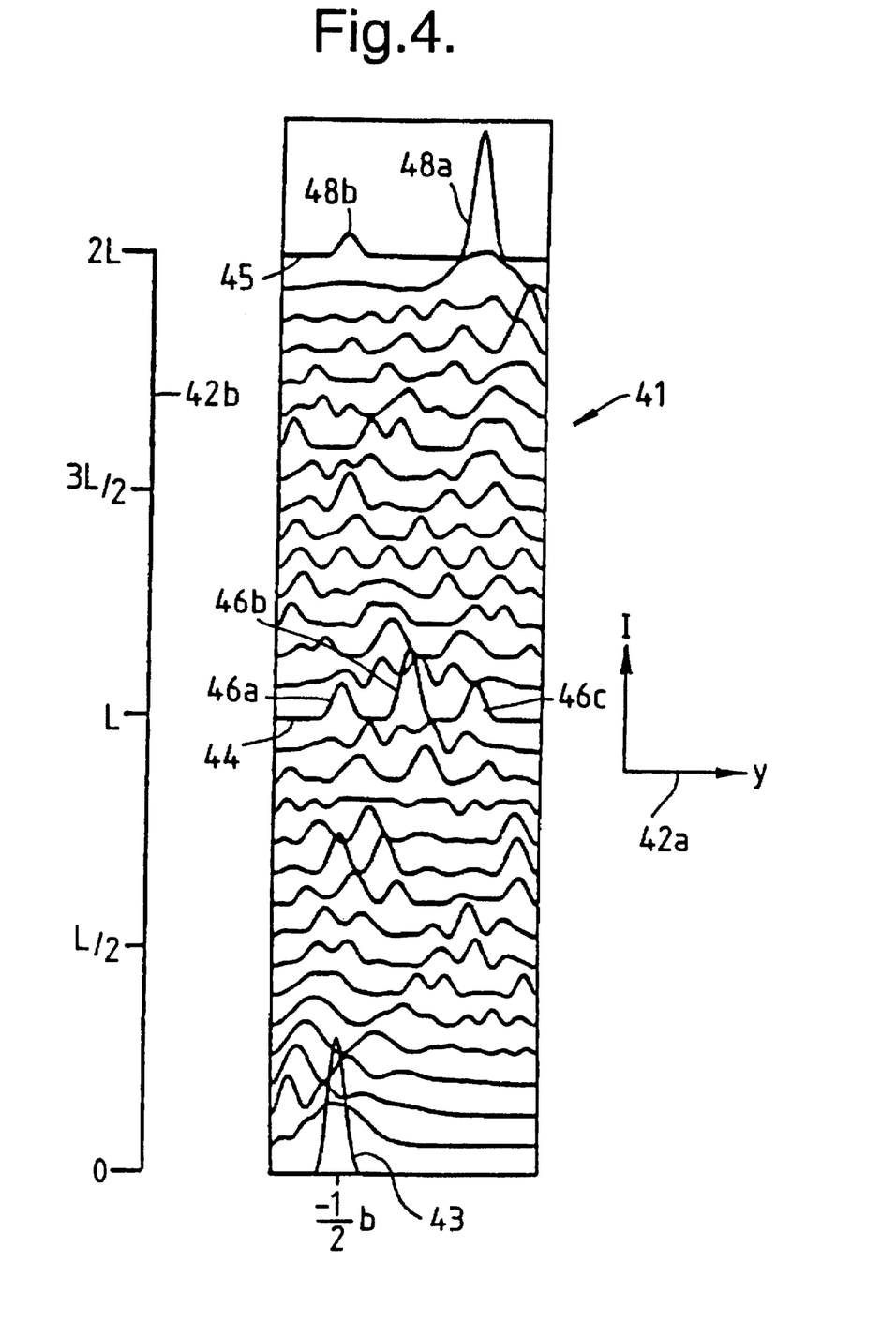
FIG. 4 shows a family of graphs illustrating electric field intensity distribution along a multi-mode waveguide of identical cross-section to a multi-mode waveguide of FIG. 1.

Referring now to FIG. 4 there is shown a family of graphs, indicated generally by 41, of electric field intensity I as a function of position y, indicated by axes 42a, across a reference waveguide (not shown). The reference waveguide is similar to the waveguide 20 except it has a length of 2L. The reference waveguide has a cross-section identical to that of the waveguide 20 as shown in FIG. 3, with height 2a and width 2b, and has the same x, y and z axis orientations relative to the length, height and width as the waveguide 20. The graphs of FIG. 4 are calculated at incremental values of z as shown by scale 42b. A square input waveguide of side 2a (not shown), treated as operating in a fundamental mode, provides an input 43 centered at y=−b/2 and bounded by y=−b/2±a. The input 43 provides for symmetric and antisymmetric modes of the reference waveguide to be excited.

The electric field intensities as a function of position at z=L and z=2L are indicated by lines 44 and 45 respectively. Line 44 shows that at z=L the electric field intensity has three maxima 46a, 46b and 46c. These maxima have relative phase differences of +13pi/8, 0 and +5pi/8 radians respectively. At z=2L, shown by line 45, the electric field intensity has two maxima 48a and 48b centred on y=±b/2. At y=+b/2 the intensity maximum 48a has an intensity approximately 85% of input 43 and at y=−b/2 the intensity maximum 48b has an intensity approximately 15% of input 43. The relative phases of the maxima 48a and 48b are pi and 0 radians respectively.

Referring again to FIG. 1, the beamsplitter waveguide 20 has a length L equal to half that described above for the reference waveguide. The mirror 26 which terminates the waveguide 20 has the effect of equating the optical properties of the waveguide 20 to those of the reference waveguide. If the mirror 26 were to be replaced by a plane mirror orthogonal to the axis 32, radiation originating from the reflection coupling waveguide 24 would be split into radiation intensity maxima at the mirror corresponding to the maxima 46a, 46b and 46c. These maxima would be reflected and the radiation divided so that 85% of the radiation intensity would be coupled to the output waveguide 22 and 15% would be coupled back to the reflection waveguide 24. The mirror 26 has a stepped profile. The stepped profile of the mirror 26 has the effect of introducing a relative phase shift in radiation reflected from the region 26a compared with that reflected from regions 26b and 26c because of a difference in path length for radiation reflected from these regions. The path length difference is equal to have a wavelength of radiation at the operating wavelength. This path difference gives a relative phase change between radiation reflected by region 26a and radiation reflected by 26b and 26c of pi radians. With the stepped profile to the mirror 26, 85% of the radiation which is coupled to the coupling waveguides is coupled to the reflection coupling waveguide and 15% of the radiation is coupled to the output coupling waveguide.

The reflecting regions 26b and 26c of the mirror 26 are arranged so as to reflect radiation corresponding to the maxima 46a and 46c respectively. The regions 26b and 26c are arranged so that the optical path length of light reflected from these regions λ/2 greater than that for radiation reflected from the central region 26a. The central region 26a corresponds to the position of an intensity maximum equivalent to the maximum 46b and has a width of 4a. The central region 26a protrudes from the regions 26b and 26c by a length equal to λ/4 or 2.65 μm for a $CO_2$ laser device operating at 10.59 μm. The mirror 26 may be fabricated by a known 'lift-off' process as follows. A copper substrate is polished to give an optically flat and smooth surface. The regions 26b and 26c are defined by an optical lithography process which leaves them coated with photoresist. Copper is then evaporated onto the substrate in a vacuum chamber so as to coat the region 26a and the photoresist with a thickness of 2.65 μm of high reflectivity metal. The photoresist is then dissolved using a suitable solvent. The metal evaporated onto the resist becomes detached, leaving the region 26a standing proud of the regions 26b and 26c by 2.65 μm.

The operation of the laser device 10 will now be described. The vacuum chamber is pumped out and filled with a conventional $CO_2$ laser gas mixture of $He/CO_2/N_2/Xe$ in the proportions 16:8:4:1 at a pressure of approximately 12 KPa which acts as the gain medium. An RF potential difference is then applied across the electrodes 29. This potential difference couples energy into the gain medium, raising the $N_2$ molecules to an energetic state which then transfer this energy to $CO_2$ molecules through collisions. The power which is fed to the electrodes 29 will depend on the geometry of the device 10 and the required intensity of radiation; a worker skilled in the art of $CO_2$ lasers would determine the required power by experimentation.

Electromagnetic radiation is produced by the spontaneous relaxation of the energetic $CO_2$ molecules to a lower energy state. When this spontaneous relaxation produces a fundamental mode field entering the waveguide 20 from the waveguide 24, beamsplitting action occurs in a similar fashion to that shown in FIG. 4. Approximately 15% of the radiation, corresponding to the maximum 48b, is coupled to the output coupling waveguide 22 and emitted as an output beam along the axis 34 and the remaining 85%, corresponding to the maximum 48a, is coupled back to the reflection coupling waveguide 24 as a fundamental mode which passes along the waveguide 24. During this "round trip" the intensity of the radiation is increased by the stimulation of further molecular relaxation processes. The radiation passing along the waveguide 24 is reflected by the mirror 27 back along the waveguide 24 and back into the beamsplitter waveguide 20, where the beamsplitting and amplification processes are repeated. The intensity of the radiation increases until, ignoring losses, the rate of energy loss through the output coupling waveguide as the output beam is equal to the energy being pumped into the gain medium by the RF electrodes 29. The mirror 27 may be adjustable so that it may be moved parallel to the axis 32. This movement changes the length of the reflection coupling waveguide 24 and enables the device 10 to be tuned so that it forms a resonant cavity.

Figures 5, 6:
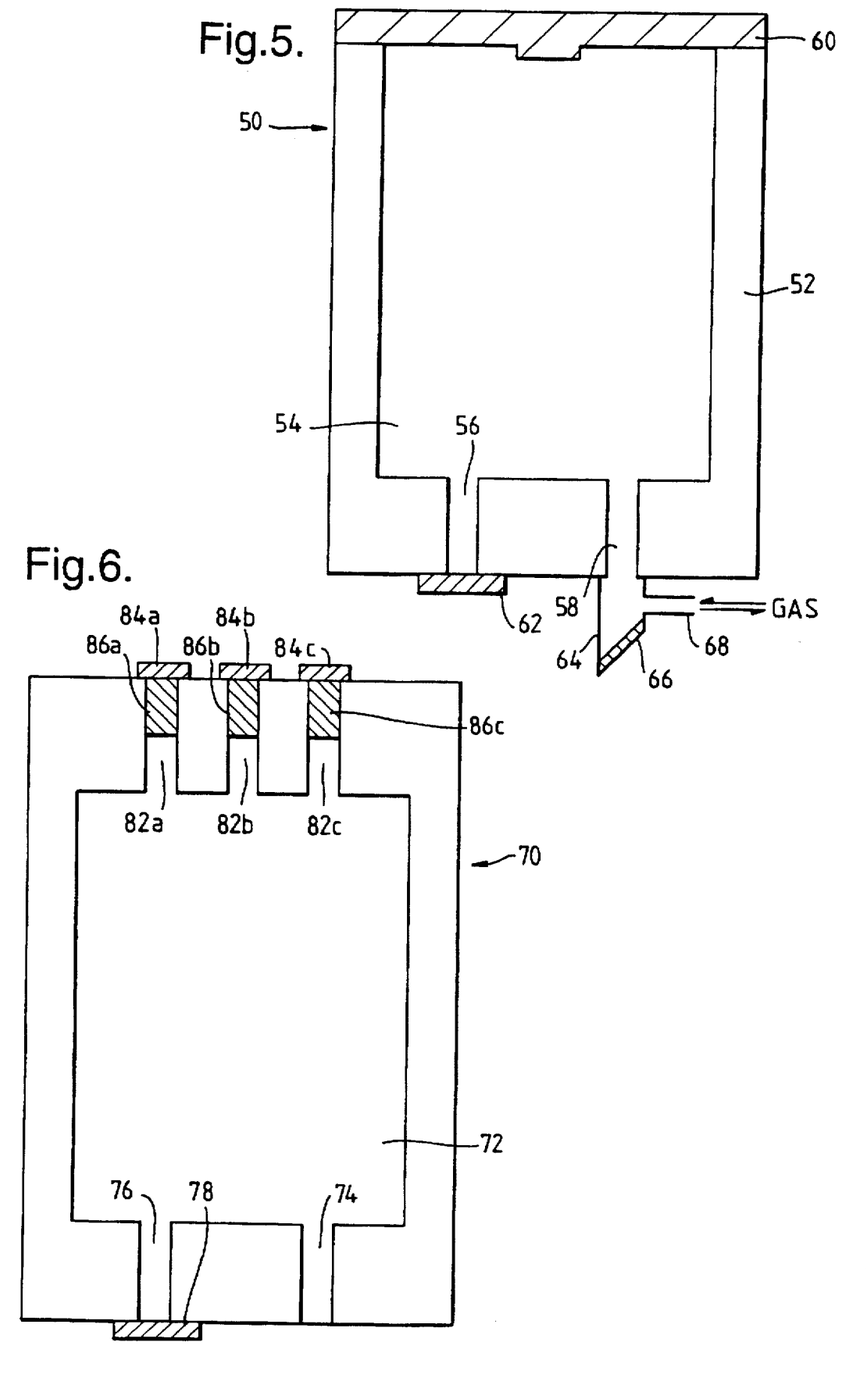
FIG. 5 illustrates a laser device of the invention incorporating a sealed cavity.
FIG. 6 is a sectional view of a laser device of the invention incorporating controllable phase modulator waveguides.

Referring now to FIG. 5, there is shown a horizontal section plan view of an embodiment of the invention configured as a sealed cavity laser device indicated generally by 50. The device 50 has a base sheet 52 formed from a solid piece of alumina by milling to produce a beamsplitter waveguide 54, a reflection coupling waveguide 56 and an output coupling waveguide 58. The waveguides 54, 56 and 58 have identical dimensions to the waveguides 20, 24 and 22 respectively. A cover sheet (not shown) comprising a planar sheet of alumina is joined to the base sheet 52 to form a gas tight seal between the sheets; this may be achieved by using a process described in UK Patent number 2 141 655 B. A stepped mirror 60 similar to the mirror 26 and a plane mirror 62 similar to the mirror 27 are joined to the device 50 also to form a gas tight seal; this may be achieved by a surface metallisation and brazing process or by gluing. The output coupling waveguide 58 has a gas pumping stem 64 attached to one end to form a gas tight seal with the device 50. Incorporated into this pumping stem 64 is a window 66 transparent at the operating wavelength of the device 50 and an output pipe 68 through which the device 50 may be evacuated and the previously described $CO_2$ laser gas mixture introduced. The window 66 may be a Brewster window, oriented at an angle appropriate for transmission of radiation with an electric field component in the plane of the window. RF electrodes (not shown) are arranged to excite the laser gas capacitively.

FIG. 6 shows a horizontal sectional view of an embodiment of a laser device of the invention indicated generally by 70 incorporating electro-optic phase modulators. The device 70 incorporates a beamsplitter waveguide 72, an output coupling waveguide 74 and a reflection coupling waveguide 76 formed in a like manner to the waveguides of the device 10. A retro-reflecting mirror 78 terminates the waveguide 76. The device 70 also incorporates three modulation waveguides 82a, 82b and 82c. The modulation waveguides 82a to 82c each comprise a square section waveguide of side 2a, and a retro-reflecting mirror 84a to 84c. Whereas in the device 10, radiation is reflected by the mirror 26 at an end of the waveguide 20 opposite the coupling waveguides 22 and 24, in the device 70 radiation is coupled into the three modulation waveguides 82a to 82c and reflected by the mirrors 84a to 84c. Each modulation waveguide incorporates an electro-optic phase modulator 86a to 86c whose optical path length is controlled by the application of an electric field across it. By altering the optical path length of each of the modulators 86a to 86c, the phase of the reflected radiation coupled back into the beamsplitter waveguide 72 is controlled.

The electro-optic phase modulators 86 are of lithium niobate to which electrodes (not shown) are attached. The phase modulators may be of other electro-optic materials including ammonium dihydrogen phosphate, potassium dihydrogen phosphate and barium titanate.

Alternatively, instead of incorporating a phase modulator 86 within the modulation waveguides 82, the lengths of the modulation waveguides may themselves be controlled. This may be achieved by mounting the mirrors 84 on piezoelectric manipulators (not shown). The lengths of the modulation waveguides 82 are each controlled by the application of a potential difference across each respective piezo-electric manipulator.

Electronic control of the optical path lengths of the modulation waveguides 82 may be used to 'trim' the phase of radiation coupled from the modulation waveguides and so counteract dimensional changes of the device 70 due to thermal expansion. In addition, the output intensity of the laser device 70 may be controlled by adjusting the optical path lengths of the modulation waveguides 82 so as to couple radiation less efficiently to the reflection coupling waveguide 76 and the output coupling waveguide 74. Alternatively, the electronic control may be used to 'Q-switch' the device 70. In the Q-switching mode of operation, the the optical path lengths of the modulation waveguides 82 are deliberately set so as to prevent the device 70 acting as a laser. Electrical contacts (not shown) to the three phase modulators 86 are connected to earth so that there is no relative phase change between radiation coupled from the three modulation waveguides. The device 70 is then in a "lossy" state and so a high density of metastable energetic $CO_2$ molecules is created. The phase modulators 86a and 86c in the waveguides 82a and 82c are then adjusted by the application of respective electric fields so that the relative phase changes are those which are required for lasing action. The phase of the radiation coupled from the waveguides 82a and 82c are retarded by pi radians with respect to the phase of the radiation coupled from the waveguide 82b. Because of the high density of energetic molecules a burst of radiation is then emitted from the output coupling waveguide 74, which, if the respective electric fields across the phase modulators are maintained, gradually decays to a steady state. If the electric contacts to the phase modulators 86a and 86c are re-connected to earth when the device 70 starts to lase, 85% of the light within the device 70 is coupled to the output coupling waveguide 74 and the device undergoes a 'cavity dump', giving an intense burst of radiation whose intensity quickly falls to near zero. This process may be repeated to give a pulsed output.

Figure 7:
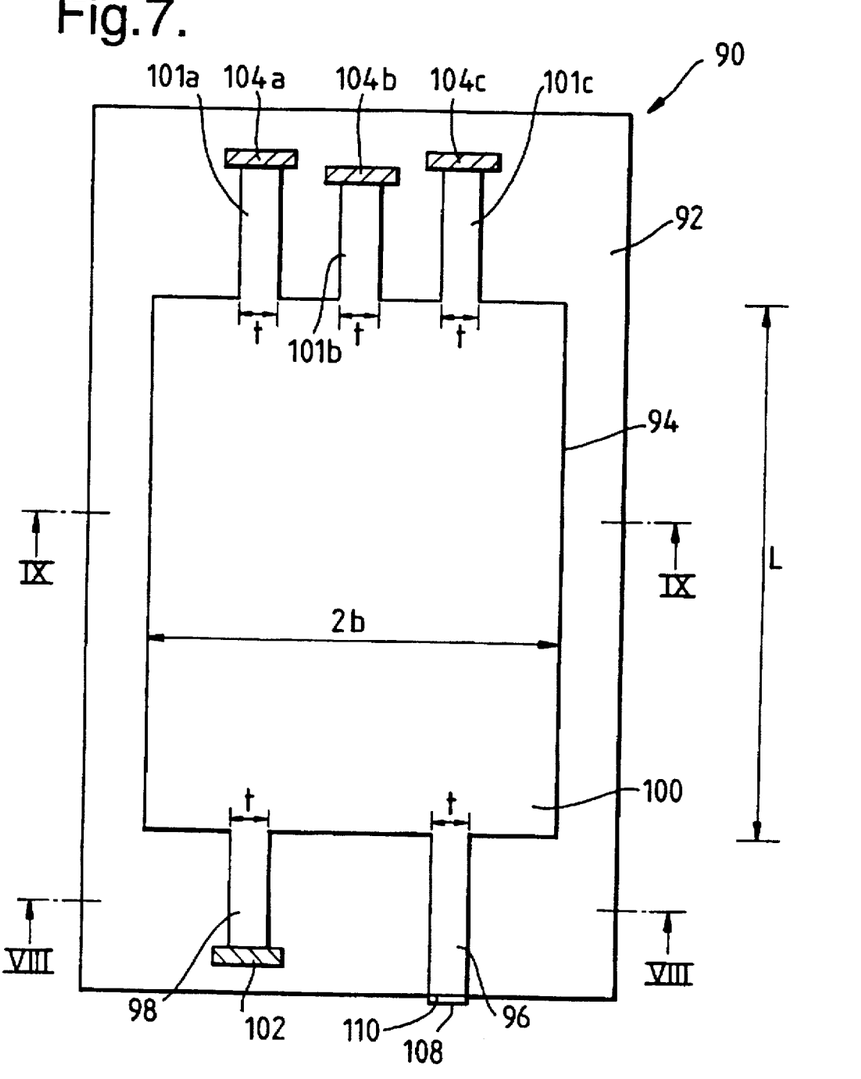
FIG. 7 is a schematic view of a laser device of the invention formed of ridge waveguides.
Figure 8:
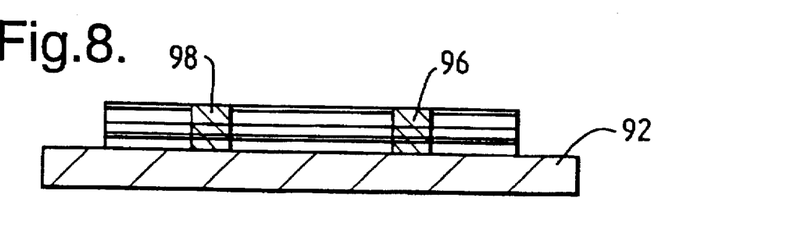
FIGS. 8 and 9 are vertical sections along lines VIII—VIII and IX—IX respectively in FIG. 7.
Figure 9:
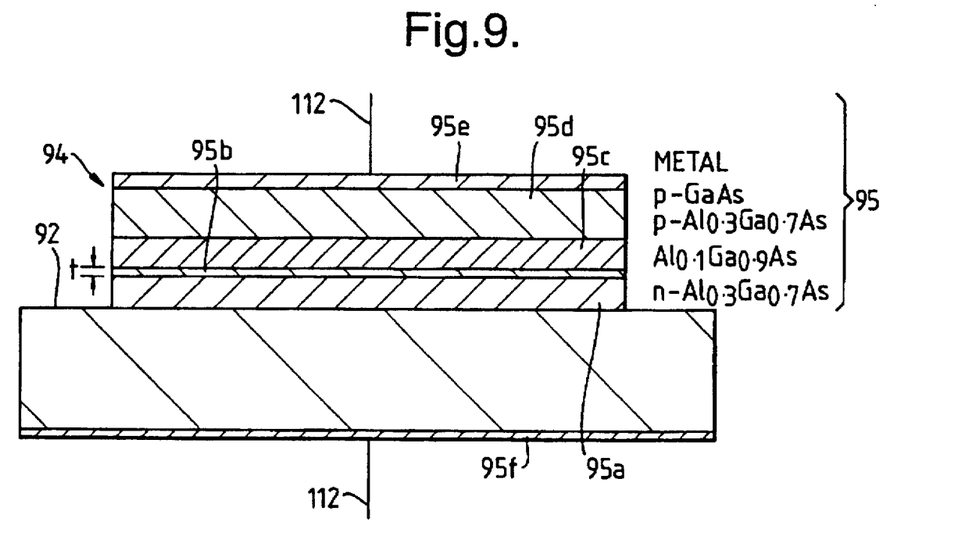

Referring now to FIGS. 7, 8, and 9, there is shown a further embodiment of the invention in the form of a solid state laser device indicated generally by 90. FIG. 7 is a horizontal section and FIGS. 8 and 9 are vertical sections on lines VIII—VIII and IX—IX in FIG. 7 respectively. The device 90 differs from previous embodiments in that it is constructed using solid waveguides. The device 90 is produced using standard semiconductor lithography techniques. The laser device 90 incorporates a substrate 92 of n-doped GaAs surmounted by a multi-layer waveguide structure 94. The waveguide structure 94 incorporates a plurality of layers of the $Ga_{1-x}Al_xAs$ system surmounted by a metallization layer as shown at 95. A base layer 95a of n-doped $Al_{0.3}Ga_{0.7}As$ is covered by an active region 95b of $Al_{0.1}Ga_{0.9}As$ of thickness t which in turn is doped by layer 95c of p-doped $Al_{0.3}Ga_{0.7}As$. The three layers 95a to 95c form a pn junction. They are surmounted by a layer 95d of p-doped GaAs and finally a metal layer 95e. Electrical connection to the device 90 is made via the metal layer 95e and a metal layer 95f on the base of the substrate 92.

Referring to FIG. 7, the device 90 incorporates an output coupling waveguide 96, a reflection coupling waveguide 98, a beamsplitter waveguide 100, and three modulation waveguides 101a to 101c. Radiation is generated and confined within the layer 95b; the layer 95b of FIG. 9 thus forms the beamsplitter waveguide 100. The beamsplitter waveguide has a thickness t which is equivalent to the dimension 2a of the device 10. The coupling waveguides 96 and 98 and the modulation waveguides 101 have a layered structure similar to that shown in FIG. 9 through without the metal layers. This layered structure provides waveguiding properties within a layer equivalent to layer 95b. The waveguides 96, 98, and 101 have a width equal to t. The beamsplitter waveguide 100 is of length L, width 2b, and height t. The length L obeys Equation (1.1), in which the refractive index n is equal to the value in the $Al_{0.1}Ga_{0.9}As$ region 95b and the free space wavelength $\lambda_o$ of operation is 0.85 μm. The device 90 incorporates retro-reflecting end mirrors 102 and 104a to 104c attached to the waveguides 98 and 101a to 101c respectively. The output coupling waveguide 96 has an anti-reflective coating 108 applied to an end 110. The lengths of the individual modulation waveguides 101a to 101c are controlled during the lithography process to ensure the correct relative phase modulation of radiation coupled into the beamsplitter waveguide as for the device 10. Thus waveguides 101a and 101c are λ/4 longer than waveguide 101b. Energy is coupled into the device 90 to raise electrons to an excited state by passing a current through the device.

Figure 10:
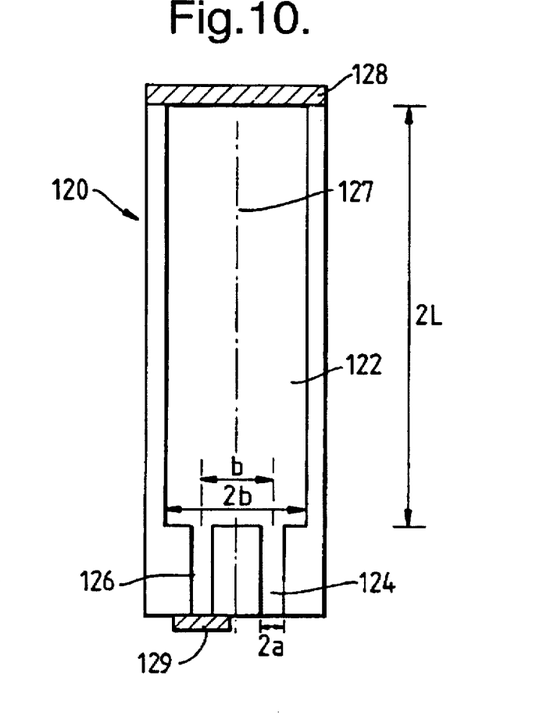
FIG. 10 is a horizontal sectional plan view of a laser device of the invention arranged to couple laser radiation intensity equally between two coupling waveguides.

Referring now to FIG. 10, there is shown in horizontal section form a laser device of the invention, indicated generally by 120 and incorporating a symmetrical beamsplitting waveguide 122 fabricated in the same manner as device 10. The device 120 incorporates the beamsplitter waveguide 122, an output coupling waveguide 124, a reflection coupling waveguide 126 fabricated in a similar manner to the device 10. The beamsplitter waveguide 122 has a length 2L where L is given by Equation (1.2), a width $2b$ and a height (not shown) of $2a$. The coupling waveguides 124 and 126 are of square cross-section with sides $2a$. The coupling waveguides 124 and 126 are positioned symmetrically on either side of a central axis 127 and are spaced b apart. The device 120 also incorporates retro-reflecting mirrors 128 and 129. Radiation coupled from the reflection waveguide 126 is split into two maxima at the mirror 128, as indicated in FIG. 4 by maxima 48a and 48b. The radiation is then reflected back towards the coupling waveguides 124 and 126. At the coupling waveguides, the radiation is divided into two equal maxima. 50% of the radiation is coupled to the reflection coupling waveguide 126 and 50% is coupled to the output coupling waveguide 124. The device 120 does not require phase modulation of the radiation at the mirror 128 for its operation.

Figure 11:
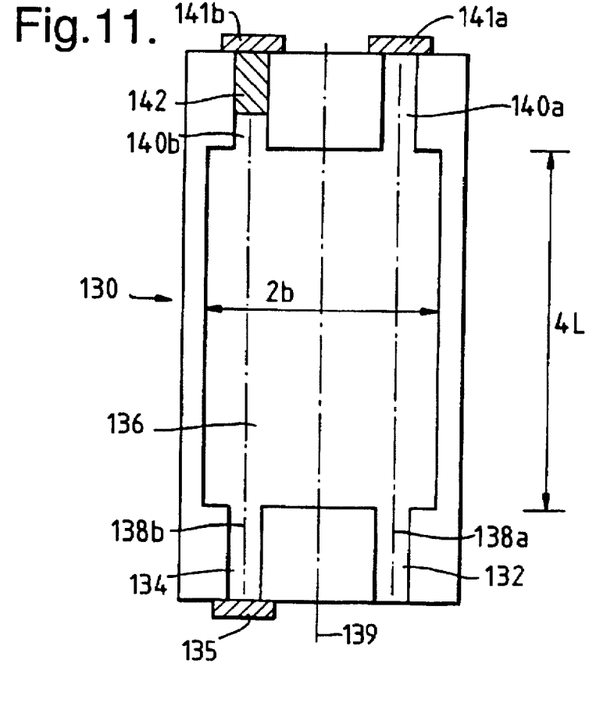
FIG. 11 is a horizontal sectional plan view of a laser device of the invention arranged for Q-switched operation.

FIG. 11 shows a Q-switched laser device of the invention indicated generally by 130. The device 130 incorporates an output coupling waveguide 132, a reflection coupling waveguide 134 terminated by a fully reflecting mirror 135, and a beamsplitter waveguide 136, fabricated in the same manner as the device 10. The beamsplitter waveguide 136 has a length 4L where L is given by Equation (1.2), a width $2b$ and a height $2a$ (not shown). The coupling waveguides 132 and 134 are positioned so that they have a central axis 138a and 138b respectively, indicated by dotted lines, symmetrically offset from a central axis 139. The device 130 also incorporates two phase modulation waveguides 140a and 140b positioned so that they have central axes coaxial with axes 138a and 138b respectively. The phase modulation waveguides 140a and 140b are terminated by fully reflecting mirrors 141a and 141b respectively. An electro-optic phase modulator 142 is incorporated into waveguide 140b. The phase modulator 142 is arranged to retard the relative phase of radiation reflected from the mirror 141b and coupled back into the beamsplitter waveguide 136 with respect to the phase of radiation coupled from the waveguide 140a by pi radians on the application of a predetermined voltage across the phase modulator 142, which is termed the (pi) voltage. RF electrodes (not shown) above and below the device 130 capacitively couple energy into a gain medium within the waveguides 136, 132, 134, 140a and 140b. The waveguide 140a may be absent, in which case the mirror 141a is positioned adjacent the beamsplitter waveguide 136, provided that the phase relationship between the radiation intensity maxima coupled back into the beamsplitter waveguide is maintained.

The device 130 operates as follows. The (pi) voltage is applied to the phase modulator 142, coupling all radiation from the reflection coupling waveguide 134 to the output coupling waveguide 132 thus creating a high loss cavity in which stimulated emission cannot occur efficiently. RF energy excites the gas molecules into an upper laser level. The phase modulator 142 is then earthed allowing lasing action to occur within the device 130 but without coupling light to the waveguide 132 thus causing a rapid build up of the intracavity field. The (pi) voltage is then re-applied to the phase modulator 142, and all the radiation is then coupled to the waveguide 132 as a short intense pulse. The process is then repeated giving a pulsed output. The intensity of the output pulse may be adjusted by adjusting the voltage applied across the phase modulator 142. If the voltage applied is not equal to the (pi) voltage, a certain proportion of the radiation within the waveguide 136 is not coupled to the output coupling waveguide 132 but is coupled to the reflection coupling waveguide 134. The relationship between the output intensity and applied voltage may be determined by routine systematic measurement. The device 130 may be operated in a continuous output mode as well as a pulsed output mode by controlling the voltage applied to the phase modulator 142.

The beamsplitter waveguide 136 may alternatively have a length of 4L/3 with the coupling waveguides 132 and 134 and modulation waveguides 140 located at positions where y is equal to $\pm b/3$.

Figure 12:
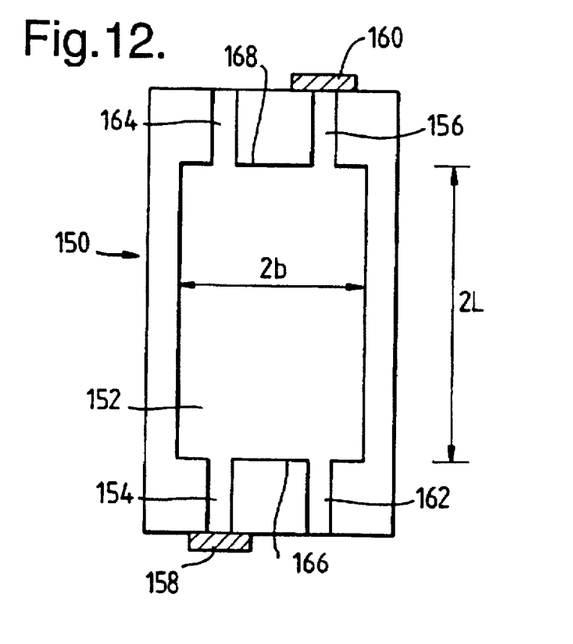
FIG. 12 is a horizontal sectional plan view of a laser device of the invention incorporating two output coupling waveguides.

FIG. 12 shows a further embodiment of the invention in the form of a double output laser device, indicated generally by 150. The device 150 incorporates a beamsplitter waveguide 152 of width $2b$, height $2a$ (not shown) and length 2L with two reflection coupling waveguides 154 and 156 terminated by fully reflecting mirrors 158 and 160 respectively. The device 150 also incorporates two output coupling waveguides 162 and 164 and RF electrodes (not shown) above and below the device to couple energy capacitively into a gain medium. The waveguides 154, 156, 162 and 164 are of square cross-section with side $2a$. The device 150 is effectively two devices 10 joined end to end without the mirror 26. The waveguides 154 and 162 at a first end 166 of the beamsplitter waveguide 152 are positioned at $y=+b/2$ and $y=-b/2$ respectively whilst the waveguides 156 and 164 at a second end 168 of the waveguide 152 are positioned at $y=-b/2$ and $y=+b/2$ respectively.

In the device 150, radiation coupled from the waveguide 154 into the waveguide 152 is amplified as it passes through the waveguide 152 and is divided into two intensity maxima at the second end 168. An intensity maximum of approximately 15% of the total radiation is coupled to the output coupling waveguide 164 and an intensity maximum of the remaining 85% is coupled to the reflection coupling waveguide 156 where it is reflected and coupled back into the waveguide 152. The radiation coupled from the waveguide 156 passes back through the waveguide 152 and is again amplified and split into two maxima at the first end. Again 15% of the total radiation is coupled to the output coupling waveguide 162 and 85% is coupled to the reflection coupling waveguide 154 and the process repeats itself. The device 150 thus has two output waveguides, and, in operation, once the device has reached a steady state, these two outputs are of equal magnitude with a constant phase relationship between them. In this configuration, the device 150 may be used to provide amplification of a signal emitted by the device and reflected of a distant object back to the device.

I claim:

1. A laser device comprising:

waveguiding means for guiding radiation, said waveguiding means having a longitudinal axis;

first reflecting means for reflecting radiation at a first end of said waveguiding means;

second reflecting means for reflecting radiation at a second end of said waveguiding means;

a radiation output port at said second end, laterally displaced with respect to said longitudinal axis from said second reflecting means; and means for exciting laser action in said waveguiding means, wherein said first and second reflecting means and said waveguiding means in combination define a resonant cavity, said cavity comprising a means for defining a radiation intensity maximum (a) at said first reflecting means;

(b) at least transiently at said second reflecting means for reflection thereby and (c) at least transiently at said radiation output port for output from said resonant cavity.

2. A laser device according to claim 1, wherein the waveguiding means comprises a multi-mode waveguide of rectangular cross-section.

3. A laser device according to claim 2, wherein the first reflecting means includes phase shifting means for introducing a relative phase shift between the radiation intensity maxima reflected by the first reflecting means.

4. A laser device according to claim 3, wherein the phase shifting means comprises at least one subsidiary waveguide arranged for propagating radiation as a fundamental mode thereof.

5. A laser device according to claim 4, wherein the said at least one subsidiary waveguide is a plurality of subsidiary waveguides each waveguide for propagation of radiation as a fundamental mode and terminated by a respective reflector.

6. A laser device according to claim 5, wherein the phase shifting means includes at least one electro-optic modulator.

7. A laser device according to claim 6, wherein the waveguiding means and the first reflecting means comprise a means for redirecting a radiation intensity maximum alternately between the second reflecting means and the radiation output port.

8. A laser device according to claim 5, wherein the reflector is adjustable in a direction parallel to a radiation propagation direction of its respective subsidiary waveguide.

9. A laser device according to claim 8, wherein said reflector is mounted on a piezo-electrically movable mount.

10. A laser device according to claim 3, wherein the radiation intensity maximum at the second reflecting means and the radiation intensity maximum at the radiation output port are of different magnitudes and said second reflecting means and said radiation output port intensity maxima magnitudes have an intensity magnitude ratio substantially equal to 85 to 15.

11. A laser device according to claim 10, wherein the intensity of the radiation intensity maximum at the second reflecting means is greater than the radiation intensity maximum at the radiation output port.

12. A laser device according to claim 10, that waveguiding means and the first reflecting means comprise in combination a means for directing the radiation intensity maximum of greater intensity alternately to the second reflecting means and to the radiation output port.

13. A laser device according to claim 1, wherein the radiation intensity maximum at the second reflecting means and the radiation intensity maximum at the radiation output port are substantially equal.

14. A laser device according to claim 1, wherein the waveguiding means comprises a hollow waveguide.

15. A laser device according to claim 14, wherein the hollow waveguide has walls, said walls comprised of alumina.

16. A laser device according to any of claim 1, wherein the waveguiding means comprises a solid waveguide.

17. A laser device according to claim 16, wherein the solid waveguide is at least partly comprised of a semiconductor material.

18. A laser device according to claim 17, wherein the semiconductor material is at least partly comprised of $Al_x Ga_{1-x} As$ where x is a number.

19. A laser device comprising:

waveguiding means for guiding radiation, said waveguiding means having a longitudinal axis;

first reflecting means for reflecting radiation at a first end of said waveguiding means;

second reflecting means for reflecting radiation at a second end of said waveguiding means;

a first radiation output port at said first end laterally displaced with respect to said longitudinal axis from said first reflecting means;

a second radiation output port at said second end, laterally displaced with respect to said longitudinal axis from said second reflecting means; and means for exciting laser action in said waveguiding means, wherein said first and second reflecting means and said waveguiding means in combination define a resonant cavity, said cavity comprising a means for defining a radiation intensity maximum (a) at said first reflecting means;

(b) at said second reflecting means for reflection thereby; and (c) at each of said first and second radiation output ports for output from said resonant cavity, wherein radiation output from said first and second output ports is non-coaxial.

20. A laser device comprising:

waveguiding means for guiding radiation, said waveguiding means having a longitudinal axis;

first reflecting means for reflecting three radiation intensity maxima at a first end of said waveguiding means and for providing a relative phase shift between said reflected intensity maxima;

second reflecting means for reflecting radiation at a second end of said waveguiding means;

a radiation output port at said second end, laterally displaced with respect to said longitudinal axis from said second reflecting means; and means for exciting laser action in said waveguiding means, wherein said first and second reflecting means and said waveguiding means in combination define a resonant cavity, said cavity comprising a means for defining (a) said three radiation intensity maxima at said first reflecting means;

(b) a radiation intensity maximum, at least transiently, at said second reflecting means for reflection thereby, and (c) a radiation intensity maximum, at least transiently, at said radiation output port for output from said resonant cavity.

* * * * *